US006903489B2

(12) United States Patent
Suzuki et al.

(10) Patent No.: US 6,903,489 B2
(45) Date of Patent: Jun. 7, 2005

(54) PIEZOELECTRIC RESONATOR, PIEZOELECTRIC RESONATOR COMPONENT AND METHOD OF MAKING THE SAME

(75) Inventors: Toshiyuki Suzuki, Tokyo (JP); Nobuyuki Miki, Tokyo (JP)

(73) Assignee: TDK Corporation, Tokyo (JP)

( * ) Notice: Subject to any disclaimer, the term of this patent is extended or adjusted under 35 U.S.C. 154(b) by 376 days.

(21) Appl. No.: 09/911,392

(22) Filed: Jul. 25, 2001

(65) Prior Publication Data

US 2002/0030419 A1 Mar. 14, 2002

(30) Foreign Application Priority Data

Jul. 25, 2000 (JP) ....................................... 2000-224641
Sep. 19, 2000 (JP) ....................................... 2000-284197

(51) Int. Cl.[7] ................................................ H01L 41/08
(52) U.S. Cl. ....................................... 310/320; 310/348
(58) Field of Search ................................ 310/320, 348, 310/365, 366, 368; H01L 41/08

(56) References Cited

U.S. PATENT DOCUMENTS 4,139,793 A * 2/1979 Michel ....................... 310/353
4,356,421 A * 10/1982 Suzuki ....................... 310/320
4,384,229 A * 5/1983 Inoue et al. ................ 310/358
4,454,444 A * 6/1984 Fujiwara et al. ............ 310/360
4,757,581 A * 7/1988 Yamada et al. ............. 310/348
5,684,436 A * 11/1997 Kaida ......................... 310/368
6,241,908 B1 6/2001 Hirose et al.
6,274,964 B1 * 8/2001 Yoshida et al. ............. 310/321

FOREIGN PATENT DOCUMENTS

| | | |
|---|---|---|
| CN | 1168569 | 12/1997 |
| EP | 1 075 082 A2 | 2/2001 |
| JP | 60-123120 | 7/1985 |
| JP | 10-242784 | 9/1988 |
| JP | 1-236715 | 9/1989 |
| JP | 7-274287 | 10/1995 |
| JP | 8-237066 | 9/1996 |
| JP | 8-288291 | 11/1996 |
| JP | 10-135215 | 5/1998 |
| JP | 11-340776 | 12/1999 |

* cited by examiner

*Primary Examiner*—Thomas M. Dougherty
*Assistant Examiner*—Karen Beth Addison
(74) *Attorney, Agent, or Firm*—Oblon, Spivak, McClelland, Maier & Neustadt, P.C.

(57) ABSTRACT

A first vibrating electrode is provided on a first side of a piezoelectric substrate perpendicular to the thickness direction. A second vibrating electrode is provided on a second side opposite to the first side to face the first vibrating electrode. A first pad and a second pad are respectively formed on a side of the piezoelectric substrate perpendicular to the thickness direction in area having a small vibration displacement. The first pad and the second pad are electrically connected to the first vibrating electrode and the second vibrating electrode.

28 Claims, 11 Drawing Sheets

342
341
A4
34
22
44
321
A2
102
322
32
351
352
35
A1
A3
332
331
33
1
101
31
21

509
539
531
531
535
535
537
537
519
513
517
503
535
535
533
533
515
537
537
521
525
505
527
523

PIEZOELECTRIC RESONATOR, PIEZOELECTRIC RESONATOR COMPONENT AND METHOD OF MAKING THE SAME

BACKGROUND OF THE INVENTION

1. Field of the Invention

The present invention relates to a piezoelectric resonator, a piezoelectric resonator component, and a method of making the same.

2. Description of the Related Art

Conventionally, piezoelectric resonator components making use of a piezoelectric transducer as a resonator for obtaining oscillation frequencies are known. An example of a piezoelectric transducer includes a piezoelectric substrate with a pair of electrodes on one side and the opposite side thereof. The piezoelectric resonator component has the piezoelectric transducer fixed to a capacity element providing two load capacities which constitute an oscillation circuit, with one side of the former perpendicular to the thickness direction facing one side of the latter perpendicular to the thickness direction. The piezoelectric resonator component also has an input electrode, an output electrode, and a grounding electrode electrically and mechanically connected to the piezoelectric transducer or the capacity element via the respective connecting conductors and is sealed with a sealing cap.

Such piezoelectric resonator components are disclosed in JP-A-60-123120, JP-A-1-236715, JP-A-8-237066, and JP-A-10-135215.

Known piezoelectric resonator components utilizing a thickness extensional vibration mode include those using a fundamental wave vibration mode and those using a harmonic wave vibration mode, especially a third harmonic wave vibration mode.

Energy-trapping resonator components are typical of piezoelectric resonator components using a third harmonic vibration mode. Since the piezoelectric substrate used in an energy-trapping resonator has parts that do not vibrate, the resonator can be fixed at these parts to provide components which hardly suffer from deterioration of characteristics and find wide applications.

Piezoelectric resonator components of thickness extensional fundamental vibration mode utilizing fundamental wave vibrations exhibit high resonance characteristics represented by a high $Q_{max}$ value. However, they hardly have non-vibrating parts unlike the energy-trapping resonators. In a small-sized component, in particular, the whole piezoelectric substrate vibrates, making it difficult to support and fix the substrate stably.

On the other hand, a piezoelectric substrate has been mounted on a dielectric substrate via joints of conductive paste dried to cure. In the case of piezoelectric resonator components using fundamental wave vibrations, the adhesive strength of the joints tends to be instable due to variation of adhesive area caused by conductive paste viscosity variation in mounting or due to seeping. Variation or reduction in joint adhesive strength is liable to lead to deterioration of characteristics due to vibration energy suppression, deterioration of resonance characteristics due to insufficient control of spurious vibrations, and oscillation defects such as instable skipping of necessary oscillation.

As another example, conventional piezoelectric resonator components have a piezoelectric transducer fixed on one side of a substrate with a connecting conductor. An input electrode, an output electrode, and a grounding electrode are connected to the substrate both electrically and mechanically via the respective connecting conductors, and subsequently the piezoelectric transducer fixed on the substrate is sealed with a cap.

In such a structure wherein a piezoelectric transducer is fixed to one side of a substrate via a connecting conductor, differences in linear expansion coefficient among the connecting conductor, the substrate and the piezoelectric transducer tend to produce thermal stress, which can develop cracks in the connecting conductors. This results in reduced reliability of interconnectivity of the components. To solve this problem, JP-A-8-288291 proposes using a connecting conductor including a resin ball coated with a solder film thereby to relax the thermal stress caused by the difference in linear expansion coefficient between the conductor, the substrate and the piezoelectric transducer.

However, because the proposed connecting conductor has a resin ball as a nucleus, it is likely that the adhesive area between the connecting conductor and the substrate or the piezoelectric transducer varies and the adhesive strength therebetween tend to be reduced. There is another problem that some components in the resin ball tend to seep and the adhesive strength therebetween tend to be reduced.

JP-A-11-340776 discloses a connecting conductor including a nucleus made of Cu, Ag, carbon, glass, ceramics, resins, etc. having an electrically conductive film formed thereon.

The above-described prior arts, however, do not teach techniques for relaxing the thermal stress arising from the difference of linear expansion coefficient because the materials proposed for forming the nucleus show linear expansion coefficients largely different from those of the piezoelectric element or the substrate.

SUMMARY OF THE INVENTION

An object of the present invention is to provide a piezoelectric resonator which can be supported stably with minimized suppression of vibration energy and to provide a component having the same.

Another object of the present invention is to provide a small-sized piezoelectric resonator which can be supported stably with minimized vibration energy suppression and to provide a component having the same.

Still another object of the present invention is provide a piezoelectric resonator which exhibits stabilized resonance characteristics with a high $Q_{max}$, a typical value representing resonance characteristics, and a component containing the same.

Further, another object of the present invention is to provide a highly reliable piezoelectric resonator component which does not develop thermal shock-induced cracks in the joints between the substrate and the piezoelectric transducer.

Furthermore, another object of the present invention is to provide a piezoelectric resonator component which does not suffer from reduction in adhesive strength at the joints between the substrate and the piezoelectric transducer.

The above objects of the invention are accomplished by a piezoelectric resonator which includes a piezoelectric substrate, a first vibrating electrode, a second vibrating electrode, a first pad, and a second pad and operates in a thickness extensional vibration mode. The piezoelectric substrate is a hexahedron. The first vibrating electrode is formed on one side of the piezoelectric substrate perpendicular to the thickness direction, and the second vibrating electrode is formed on the opposite side of the piezoelectric substrate to face the first vibrating electrode.

The first pad and the second pad are formed in an area having the least vibration displacement on at least one side of the piezoelectric substrate perpendicular to the thickness direction. The first pad and the second pad are made of an electrical conductor and electrically connected to the first vibrating electrode and the second vibrating electrode, respectively.

In the piezoelectric resonator according to the invention, the first vibrating electrode is formed on one side of the piezoelectric substrate which is perpendicular to the thickness direction, and the second vibrating electrode is formed on the opposite side of the piezoelectric substrate to face the first vibrating electrode. Thus, on applying electrical energy to the pair of the vibrating electrodes, the piezoelectric resonator vibrates in a thickness extensional vibration mode.

The first pad and the second pad are both made of an electrical conductor and are electrically connected to the first and the second vibrating electrodes, respectively. Thus, the pair of the pads are capable of exciting the piezoelectric resonator on electrical energy application.

In the present invention, the first pad and the second pad are each positioned in an area having a small vibration displacement. As a result, the piezoelectric resonator can be supported stably via these pads while minimizing vibration energy suppression. Specifically, the first pad and the second pad are respectively formed in a corner area on at least one side perpendicular to the thickness direction of the piezoelectric substrate. This is because a hexahedral piezoelectric substrate shows the least vibration displacement in the four corner areas at the fundamental frequency of the thickness extensional vibration mode.

The above action and effect make it feasible to provide a piezoelectric resonator that exhibits stabilized resonance characteristics with a high $Q_{max}$, a typical value representing resonance characteristics, while suppressing dissipation of vibration energy, controlling spurious vibrations, and preventing deterioration of resonance characteristics and oscillation defects such as instable skipping of necessary oscillation.

The present invention is particularly effective in piezoelectric resonators of thickness extensional vibration mode using fundamental wave vibrations. As stated above, this type of piezoelectric resonators exhibit high resonance characteristics (large $Q_{max}$) because of use of fundamental wave vibrations. However, vibrations propagate throughout the whole body of the piezoelectric substrate unlike the energy-trapping type, which makes fixation of the substrate difficult. The smaller the size, the higher the difficulty. According to the invention, since the first and the second pads are formed on areas having a small vibration displacement, suppression of vibration energy can be minimized to enable stable support and fixing of the piezoelectric resonator.

The first pad and the second pad preferably include an electrically conductive film and a bump. The conductive film is adhered to the surface of the piezoelectric substrate, and the bump is adhered to the conductive film.

Conductive paste has been used to mount the piezoelectric substrate on a dielectric substrate, etc. In the case of piezoelectric resonators using a fundamental wave vibration mode, however, the joints made of conductive paste tend to have instable adhesive strength due to variation of adhesive area caused by viscosity variation in mounting or due to seeping. Variation or reduction in joint adhesive strength is liable to cause deterioration of characteristics due to vibration energy suppression, deterioration of resonance characteristics due to insufficient control on spurious vibrations, and oscillation defects such as instable skipping of necessary oscillation. These problems arising from conductive paste can be settled by forming the first and second pads by adhering the conductive film on the surface of the piezoelectric substrate and then adhering the bump on the conductive film.

The present invention also provides a piezoelectric resonator component including the above-described piezoelectric resonator and a substrate and a method of making the component.

Moreover, the objects of the invention are accomplished by a piezoelectric resonator component including a piezoelectric transducer, a substrate, and connecting conductors, wherein the piezoelectric transducer has a ceramic piezoelectric element, vibrating electrodes, and lead electrodes, and the substrate has terminal electrodes on the surface thereof.

The connecting conductors include a support and an electrically conductive material coated to the surface of the supports and are respectively disposed between the lead electrode of the transducer and the terminal electrode of the substrate to electrically and mechanically connect and fix these electrodes. The supports of the connecting conductor includes ceramics whose linear expansion coefficient is approximate to that of the piezoelectric element or the substrate.

As described above, the piezoelectric transducer used in the piezoelectric resonator component of the invention includes a piezoelectric element having vibrating electrodes and lead electrodes, and the substrate has terminal electrodes on the surface thereof. The connecting conductor is disposed between the lead electrode of the piezoelectric transducer and the terminal electrode of the substrate to connect them electrically and mechanically. According to this structure, the connection to the lead electrode can be made through a point contact by using, for example, a ball-shaped connecting conductor. As a result, the piezoelectric transducer can be supported stably while minimizing vibration energy suppression. Even in a small-sized resonator component, this connection structure is readily adaptable and effective in stably supporting a piezoelectric transducer while minimizing vibration energy suppression by properly selecting the size of the connecting conductor.

The above action and effect make it feasible to provide a piezoelectric resonator component that exhibits stabilized resonance characteristics with a high $Q_{max}$, a typical value representing resonance characteristics, while suppressing dissipation of vibration energy, controlling spurious vibrations, and preventing deterioration of resonance characteristics and oscillation defects such as instable skipping of necessary oscillation.

Further, since the support of the connecting conductor includes ceramics, the linear expansion coefficient of which is close to that of the piezoelectric element or the substrate, the connecting conductor does not develop cracks due to thermal stress. Unlike conventional resin balls, the connecting conductor of the invention does not change the adhesive area with the substrate or the piezoelectric transducer nor causes seeping of the constituent components which may lead to reduction of adhesive strength.

The other objects, constitution and advantages of the present invention will be described in more detail with reference to the accompanying drawings. The drawings are presented only for illustrative purposes but not for limitation.

DETAILED DESCRIPTION OF THE PREFERRED EMBODIMENTS

Figure 1:
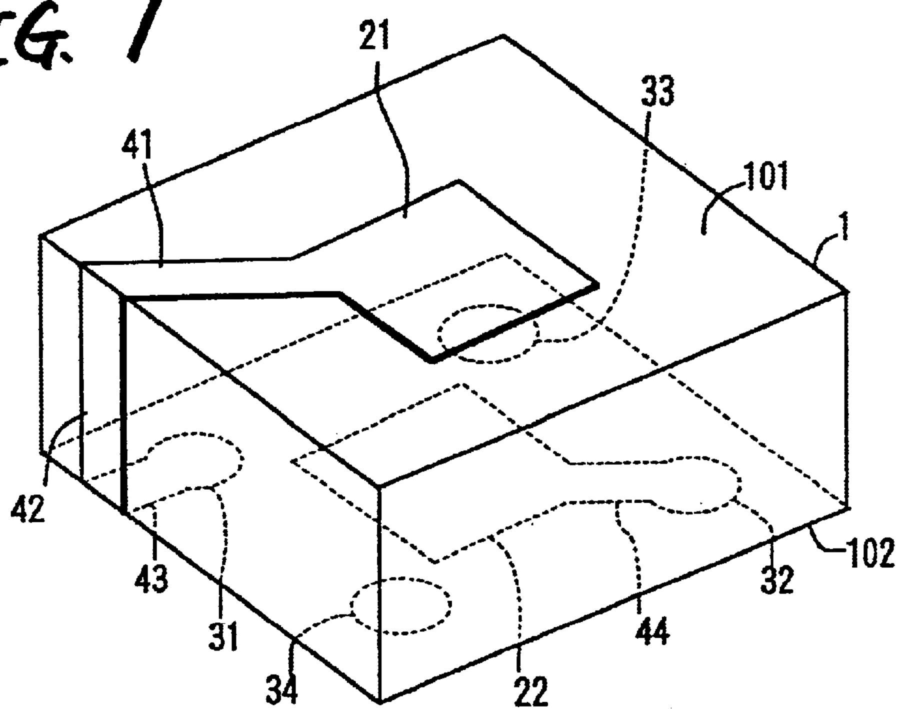
FIG. 1 is a perspective view of a piezoelectric resonator according to the present invention, seen from its surface side.
Figure 2:
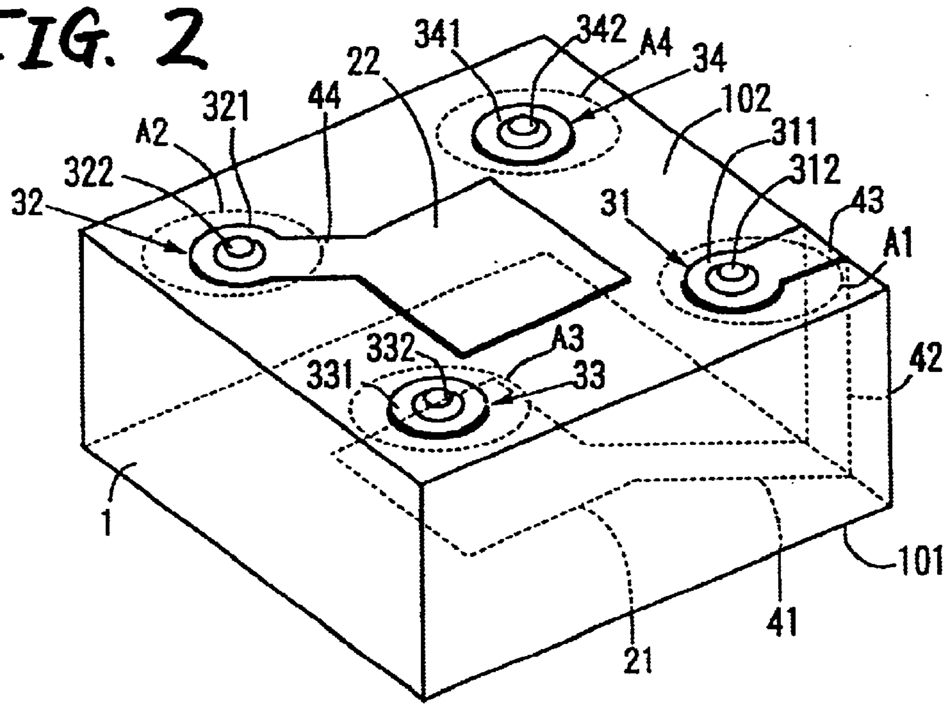
FIG. 2 is a perspective view of the piezoelectric resonator shown in FIG. 1, seen from its back side.

FIG. 1 is a perspective view of a piezoelectric resonator according to an element of the present invention, seen from its surface side. FIG. 2 is a perspective view of the piezoelectric resonator shown in FIG. 1, seen from its back side. The shown piezoelectric resonator includes a piezoelectric substrate 1, a first vibrating electrode 21, a second vibrating electrode 22, a first pad 31, and a second pad 32 and operates in a thickness extensional vibration mode, more particularly, in a fundamental wave vibration mode.

The piezoelectric substrate 1 is, for example, 1.2 mm wide, 1.2 mm long and 0.5 mm thick.

The piezoelectric substrate 1 is prepared by polishing a sintered product to a prescribed thickness and subjecting to polarization in a high electrical field. The piezoelectric substrate 1 is preferably made of a lead-free material not including PbO from the environmental consideration. The piezoelectric substrate 1 can be made of a piezoelectric material having an effective Poisson's ratio of less than ⅓. A satisfactory wave form can be obtained for a fundamental wave even with such a material as has an effective Poisson's ratio of less than ⅓.

Piezoelectric materials having an effective Poisson's ratio of less than ⅓ include compounds having a perovskite structure, such as tantalic acid compounds and niobic acid components, and their solid solutions; compounds having an ilumenite structure and solid solutions thereof; compounds having a pyrochlore structure; bismuth compounds with layer structure; and compounds having a tungsten-bronze structure. The piezoelectric substarate 1 according to this element includes at least one of these materials as a major component.

The tantalic acid compounds and niobic acid compounds include those including at least one first element selected from sodium (Na), potassium (K), lithium (Li), etc., at least one second element selected from tantalum (Ta) and niobium (Nb), and oxygen, which are represented by formula:

$$ABO_3$$

wherein A is the first element, and B is the second element.

The bismuth compounds with layer structure includes those including bismuth, at least one first element selected from sodium, potassium, barium (Ba), strontium (Sr), lead (Pb), calcium (Ca), yttrium (Y), lanthanides (Ln), bismuth, etc., at least one second element selected from vanadium (V), zirconium (Zr), antimony (Sb), titanium (Ti), niobium, tantalum, tungsten, molybdenum (Mo), etc., and oxygen, which is represented by formula:

$$(Bi_2O_2)^{2+}(C_{m-1}D_mO_{3m+1})^{2-}$$

wherein C is the first element; D is the second element; and m represents an integer of from 1 to 8.

The tungsten bronze compounds, which are not represented by a general formula, include $NaWO_6BaNaNbO_{15}$, for example.

While the chemical formulae given above represent stoichiometric compounds, the piezoelectric materials which can constitute the piezoelectric substrate 1 do not need to have a stoichiometric composition.

Of the above materials, bismuth compounds with layer structure are preferred as a material constituting the piezoelectric substrate 1 for their high mechanical quality factor $Q_m$ and high Curie temperature, which will secure excellent characteristics as a resonator. For example, compounds with layer structure including bismuth, strontium, titanium and oxygen are still preferred. Further, those further including lanthanum are particularly preferred.

The first vibrating electrode 21 is provided on a side 101 of the piezoelectric substrate 1 which is perpendicular to the thickness direction, and the second vibrating electrode 22 is disposed on an opposite side 102 of the piezoelectric substrate 1 which is also perpendicular to the thickness direction. The first vibrating electrode 21 and the second vibrating electrode 22 are facing each other. The shape of the first vibrating electrode 21 and the second vibrating electrode 22 includes a rectangle, as in this particular element, and a circle. These vibrating electrodes 21 and 22 can be formed by thin film formation methods, such as vacuum deposition and sputtering, or a screen printing method. Materials which can be used to form the vibrating electrodes include Au, Ag, Cu, Cr, and alloys thereof.

The first pad 31 and the second pad 32 are provided in corner areas A1 and A2, respectively, which are on the side

102 of the piezoelectric substrate perpendicular to the thickness direction. Within the corner areas A1 and A2, areas having particularly small vibration displacements should be selected to form these pads. While the first pad 31 and the second pad 32 of this embodiment shown in FIG. 2 are circular, other shapes, such as angular shapes, are also usable.

The first pad 31 is made of a conductor and is electrically connected to the first vibrating electrode 21. In the present embodiment, the first pad 31 is formed on the side 102 opposite to the side 101 where the first vibrating electrode 21 is formed, so that the electrical connection between the first pad 31 and the first vibrating electrode 21 is made via a lead electrode 42 passing along the side 101 and the other side 102. The lead electrode 42 is, in principle, made of the same conductive material as used in the first vibrating electrode 21.

Figure 3:
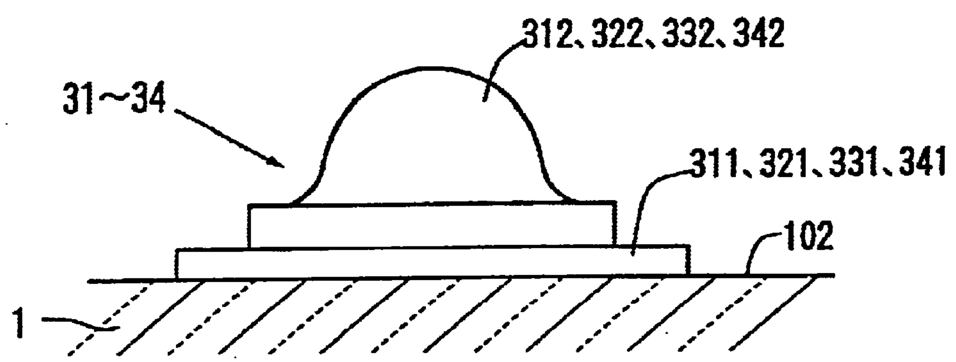
FIG. 3 is an enlarged view of a part of the pad shown in FIG. 1.

As shown in an enlarged view of FIG. 3, the first pad 31 includes an electrically conductive film 311 and a bump 312. The conductive film 311 is directly attached to the side 102 of the piezoelectric substrate 1. The bump 312 is adhered to the conductive film 311 as a protrusion. The bump 312 can be made of at least one material selected from Au, Pt, Pd, Ag, Cu, Ni, Al, an alloy thereof, and solder. The same applies to the conductive film 311.

The second pad 32 is made of a conductor and is electrically connected to the second vibrating electrode 22. In the present element, the second pad 32 is formed on the side 102 where the second vibrating electrode 22 is formed. The electrical connection between the second pad 32 and the second vibrating electrode 22 is made via a lead electrode 44 formed on the side 102. The lead electrode 44 is, in principle, made of the same conductive material as used in the second vibrating electrode 22.

The second pad 32 includes an electrically conductive film 321 and a bump 322 similarly to the first pad 31 as explained with reference to FIG. 3. The conductive film 321 is directly attached to the side 102 of the piezoelectric substrate 1, and the bump 322 is adhered to the conductive film 321 as a protrusion (see FIG. 3). The thickness of the second pad 32 is the same as that of the first pad 31.

The piezoelectric resonator according to the element shown in FIGS. 1 and 2 further has a third pad 33 and a fourth pad 34. The third pad 33 and the fourth pad 34 are provided in corner areas A3 and A4, respectively, on the side 102 of the piezoelectric substrate 1. Within the corner areas A3 and A4, areas having particularly small vibration displacements should be selected to form these pads. The thickness of the third pad 33 and the fourth pad 34 is the same as that of the first and the second pads 31 and 32. While the third pad 33 and the fourth pad 34 of the element shown are circular, other shapes, such as angular shapes, are also usable.

The third pad 33 used in the present element includes an electrically conductive film 331 and a bump 332 as shown in FIG. 3. The conductive film 331 is directly attached to the side 102 of the piezoelectric substrate 1, and the bump 332 is adhered to the conductive film 331 as a protrusion.

The fourth pad 34 includes an electrically conductive film 341 and a bump 342 similarly to the first pad 31 as has been explained with reference to FIG. 3. The conductive film 341 is directly attached to the side 102 of the piezoelectric substrate 1, and the bump 342 is adhered to the conductive film 341 as a protrusion (see FIG. 3).

The conductive films 321, 331, and 341 and the bumps 322, 332, and 342 in the second to fourth pads 32, 33, and 34 can be made of at least one material selected from Au, Pt, Pd, Ag, Cu, Ni, Al, an alloy thereof, and solder.

As described above, in the piezoelectric resonator according to the present invention the first vibrating electrode 21 is provided on the side 101 (one side perpendicular to the thickness direction) of the piezoelectric substrate 1, and the second vibrating electrode 22 is disposed on the opposite side 102 of the piezoelectric substrate 1. The first vibrating electrode 21 and the second vibrating electrode 22 are facing each other. Thus, on supplying electrical energy to the pair of the vibrating electrodes 21 and 22, the piezoelectric resonator operates at the fundamental frequency of the thickness extensional vibration mode.

The first pad 31 and the second pad 32 are both made of a conductor and are electrically connected to the first vibrating electrode 21 and the second vibrating electrode 22, respectively. Thus, the pair of the pads 31 and 32 are capable of exciting the piezoelectric resonator on electrical energy application.

Figure 4:
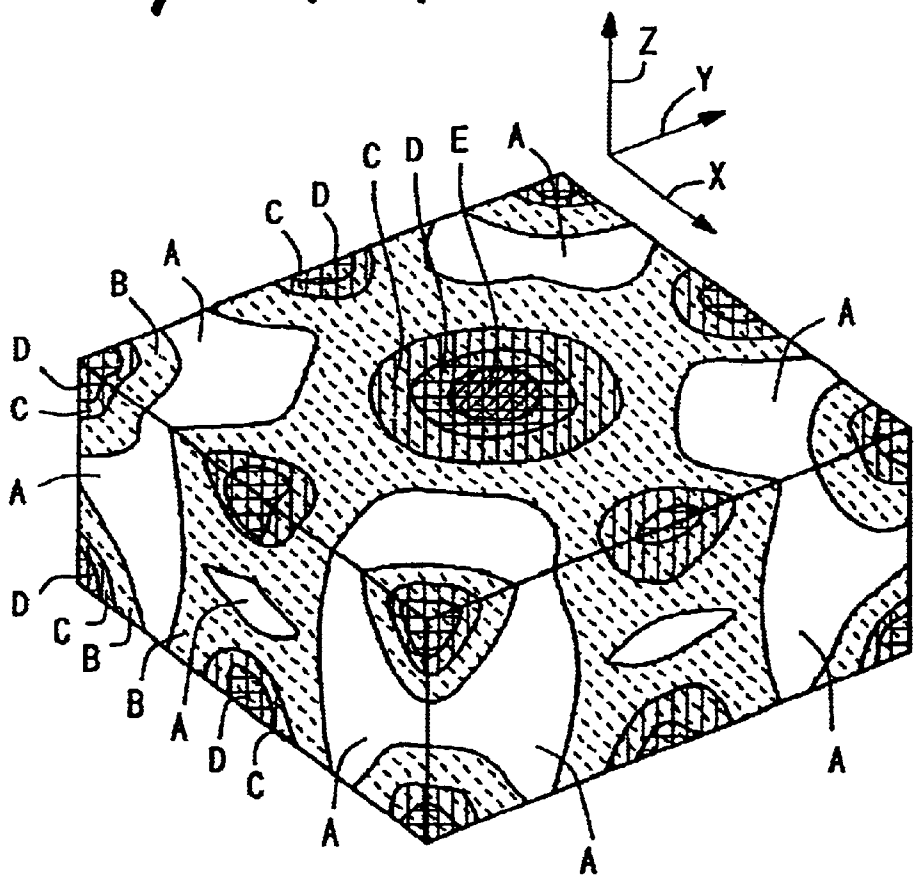
FIG. 4 is a computer-simulated vibration displacement distribution in the piezoelectric resonator shown in FIGS. 1 and 2.

FIG. 4 is a computer-simulated vibration displacement distribution in the piezoelectric resonator shown in FIGS. 1 and 2. In FIG. 4, the vibration displacement is displayed on an A-to-E five scale. Area A represented by a blank has the smallest displacement. The displacement increases in the order of area B (shadowed with broken lines), area C (shadowed with vertical solid lines), area D (shadowed with transverse solid lines), and area E (shadowed with slant solid lines).

As illustrated in FIG. 4, when the hexahedral piezoelectric substrate 1 is operated at the fundamental frequency of the thickness extensional vibration mode, area A having the least vibration displacement appears in the four corner areas A1 to A4. In the element shown in FIGS. 1 and 2, the first and second pads 31 and 32 are provided in corner area A1 and A2, respectively, namely, areas having a small vibration displacement. As a result, the first and second pads 31 and 32 are capable of bearing the piezoelectric resonator stably while minimizing the vibration energy suppression.

In the element shown, the third and fourth pads 33 and 34 are formed in corner areas A3 and A4, respectively, on the side 102 of the piezoelectric substrate 1. Thus, there are provided four supports, i.e., the first to the fourth pads 31, 32, 33 and 34 and, in addition, the vibration energy suppression by the third and fourth pads 33 and 34 can be minimized. As a result, the piezoelectric resonator can be supported more stably. Either one of the third pad 33 and the fourth pad 34 may be omitted to provide a three-point supporting structure.

Further, in the element of FIGS. 1 and 2, since lead electrode 42 is also provided in the area having a small vibration displacement (area A), the vibration energy suppression by the lead electrode 42 is also minimized to secure stable support of the piezoelectric resonator.

The above action and effect make it feasible to provide a piezoelectric resonator that exhibits stabilized resonance characteristics with a high $Q_{max}$, a typical value representing resonance characteristics, while suppressing dissipation of vibration energy, controlling spurious vibrations, and preventing deterioration of resonance characteristics and oscillation defects such as instable skipping of necessary oscillation.

The first to fourth pads 31, 32, 33 and 34 used in the present element include electrically conductive films 311, 321, 331 and 341, respectively, and bumps 312, 322, 332 and 342, respectively. Each of these conductive films is adhered to the surface of the piezoelectric substrate 1, and the bumps are adhered to the respective conductive films.

Conductive paste has been used to mount a piezoelectric resonator on a dielectric substrate, etc. In the case of piezoelectric resonators using a fundamental frequency of the thickness extensional vibration mode, however, the joints made of conductive paste tend to have instable adhesive strength due to variation of adhesive area caused by paste viscosity variation in mounting or due to seeping. Variation or reduction in joint adhesive strength is liable to cause deterioration of characteristics due to vibration energy suppression, deterioration of resonance characteristics due to insufficient control on spurious vibrations, and oscillation defects such as instable skipping of necessary oscillation. These problems arising from conductive paste can be solved by forming the first to fourth pads 31, 32, 33 and 34 by adhering the conductive film 311, 321, 331 or 341 on the surface of the piezoelectric substrate 1 and then adhering the bump 312, 322, 332 or 342 on the conductive film 311, 321, 331 or 341 by ultrasonic welding, soldering or a like means.

Figure 5:
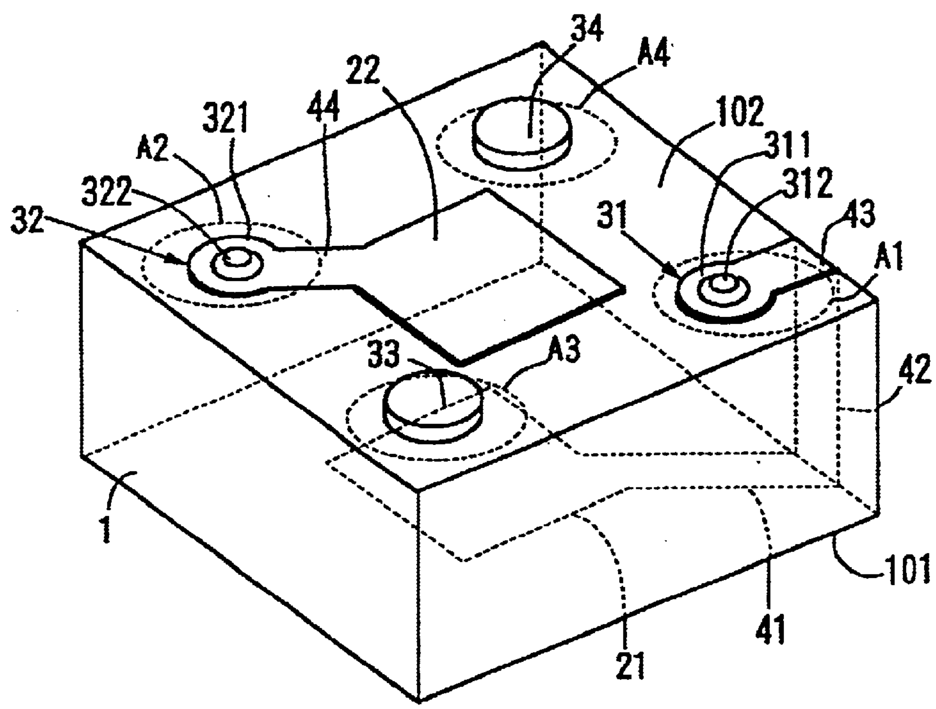
FIG. 5 is a perspective view showing another element of the piezoelectric resonator according to the present invention.

FIG. 5 is a perspective view showing another element of the piezoelectric resonator according to the present invention. The same constituent members as in FIGS. 1 and 2 are given the same reference numbers as used in FIG. 1 and 2. In the element shown in FIG. 5, the third pad 33 and the fourth pad 34 are made of an insulator. This element shows that the third and fourth pads 33 and 34 do not always need to have an electrically conductive structure like the first and second pads 31 and 32.

Figure 6:
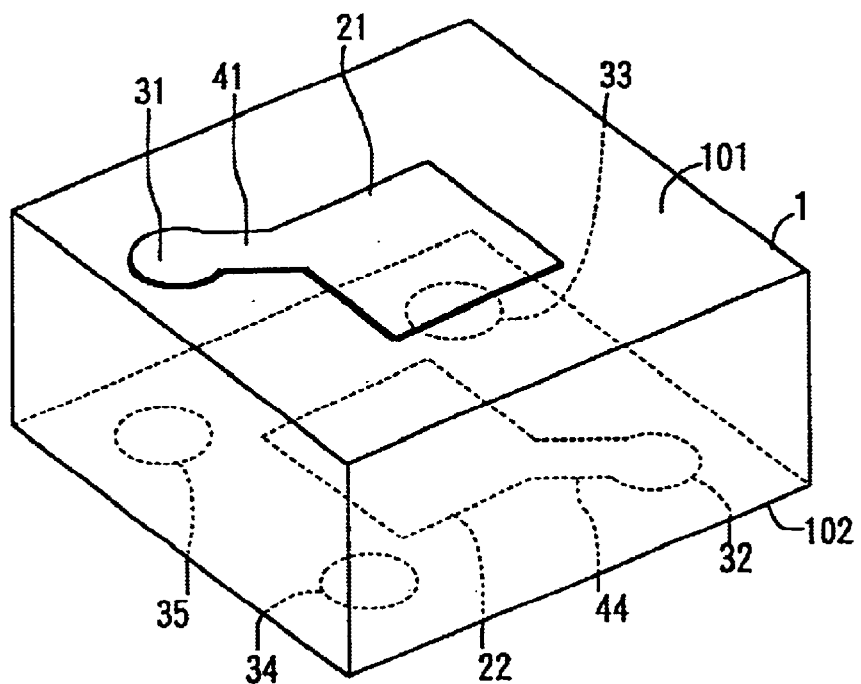
FIG. 6 is a perspective view showing still another element of the piezoelectric resonator according to the invention, seen from its surface side.
Figure 7:
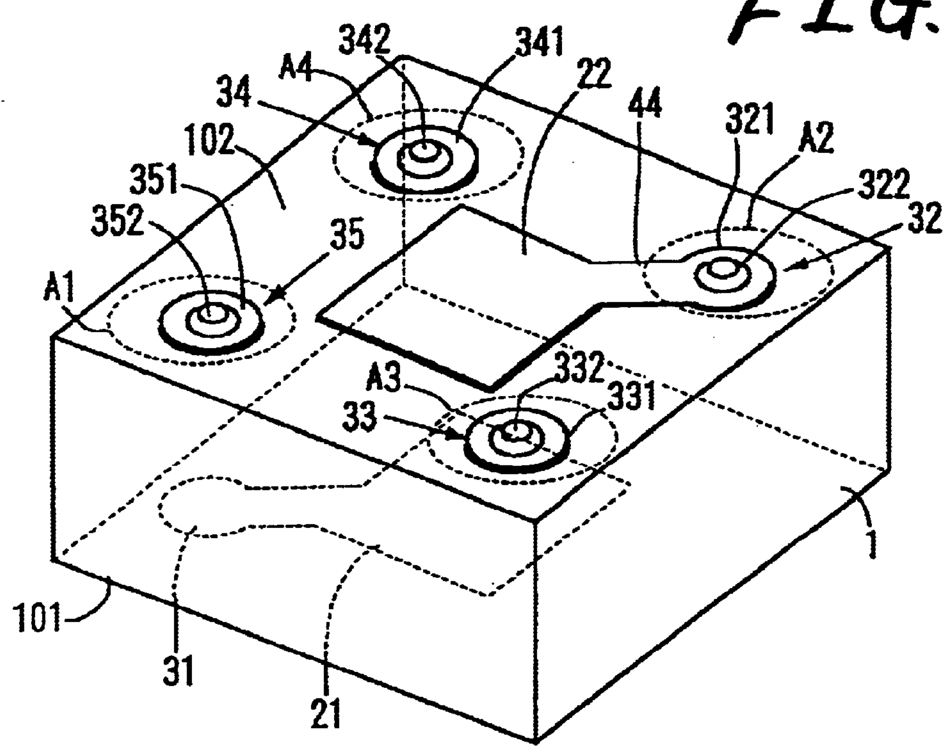
FIG. 7 is a back side perspective view of the piezoelectric resonator shown in FIG. 6.

FIG. 6 is a perspective view showing still another element of the piezoelectric resonator according to the invention, seen from its surface side. A back side perspective view of the element of FIG. 6 is shown in FIG. 7. In these figures, the same constituent members as in FIGS. 1 and 2 are given the same reference numbers as used in FIGS. 1 and 2. In this element, the first pad 31 is provided in the corner area A1 on the side 101 of the piezoelectric substrate 1, while the second pad 32, the third pad 33, the fourth pad 34, and a fifth pad 35 are formed on the other side 102 of the piezoelectric substrate 1. In other words, the first pad 31 and the second pad 32 can be disposed on different sides.

Figure 8:
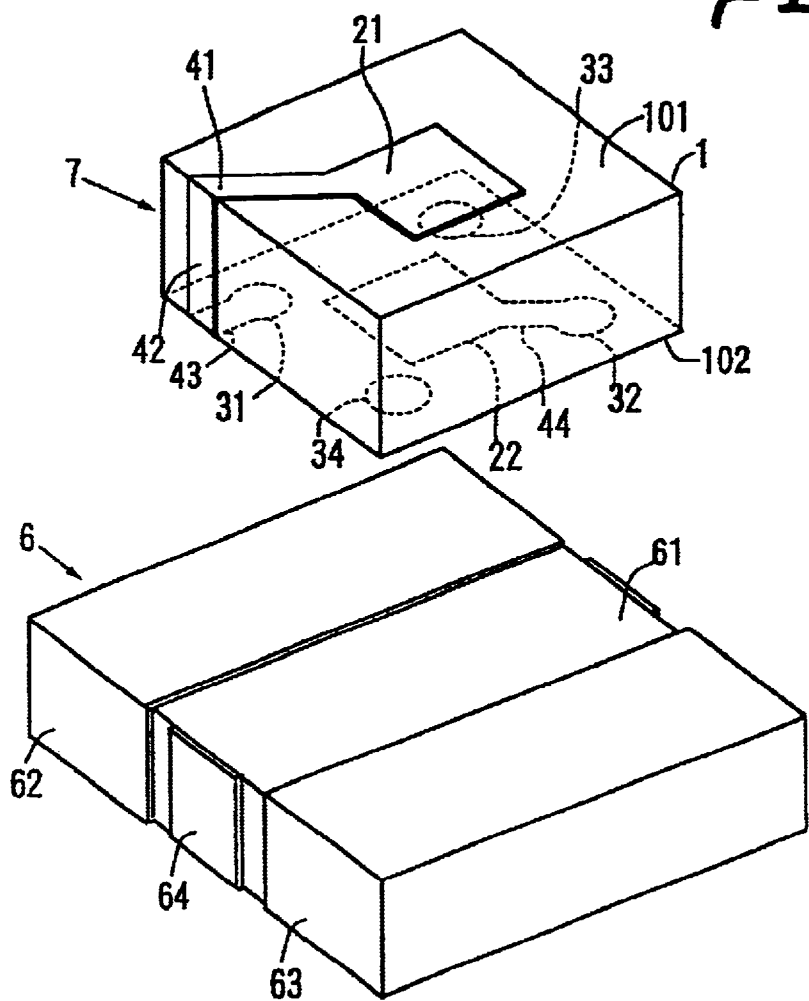
FIG. 8 illustrates a step in assembly of a piezoelectric resonator component having a piezoelectric resonator according to the invention.
Figure 9:
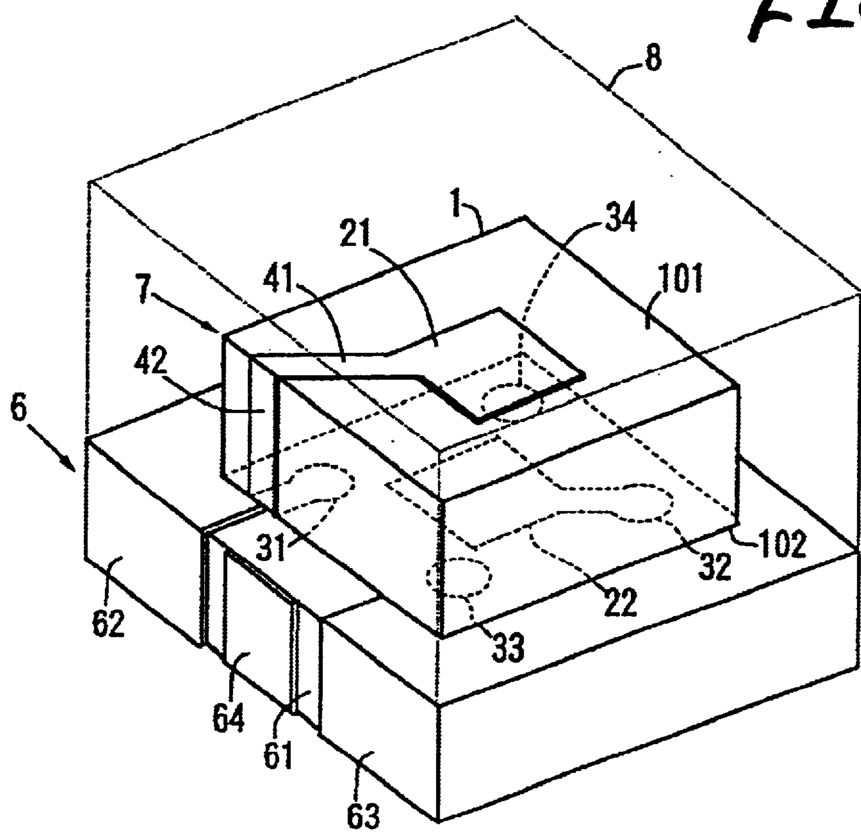
FIG. 9 is a perspective view of the piezoelectric resonator component obtained by the step shown in FIG. 8.

FIG. 8 illustrates a step in assembly of a piezoelectric resonator component having a piezoelectric resonator according to the invention. FIG. 9 is a perspective view of the piezoelectric resonator component obtained by the step shown in FIG. 8. The shown piezoelectric resonator component includes a piezoelectric resonator 7, a substrate 6, and a sealing case 8.

The piezoelectric resonator 7 is the one shown in FIGS. 1 and 2. The first to fourth pads 31 to 34 have already been formed on the side 102 of the piezoelectric resonator 7.

The substrate 6 is a dielectric base 61 with three terminal electrodes 62, 63 and 64 formed on the surface thereof in a band form at a certain interval. Of these terminal electrodes, the terminal electrodes 62 and 63 are connecting terminals, while the terminal electrode 64 is an intermediate grounding electrode.

Figure 10:
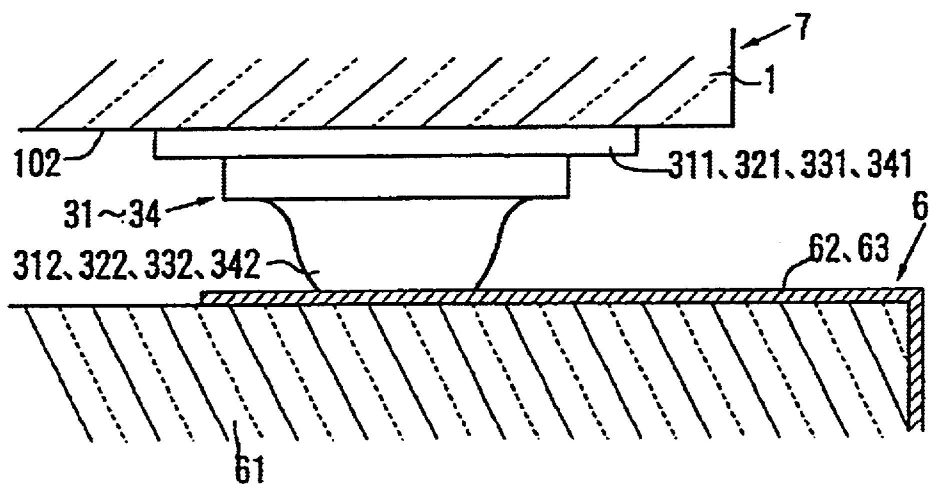
FIG. 10 is an enlarged view of a part of the piezoelectric resonator component shown in FIG. 9.

In assembly, the piezoelectric resonator 7 is mounted on the substrate 6 by joining the first to fourth pads 31, 32, 33 and 34 to the terminal electrodes 62 and 63 via the bumps 312, 322, 332, and 342 as shown in FIG. 10.

Figure 11:
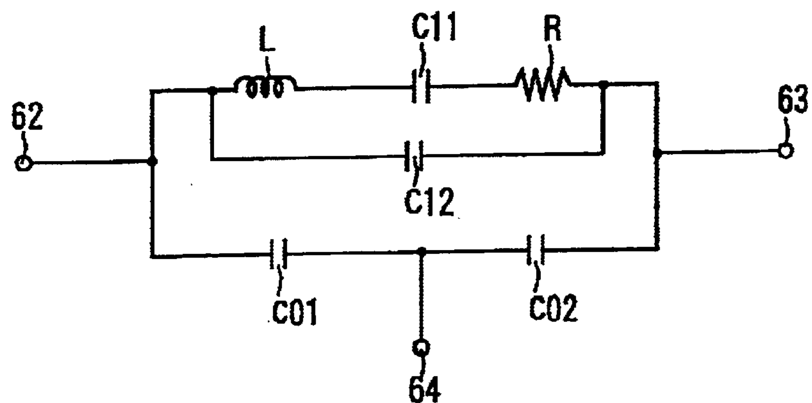
FIG. 11 is an electrically equivalent circuit of the piezoelectric resonator component shown in FIGS. 9

FIG. 11 is an electrically equivalent circuit of the piezoelectric resonator component shown in FIGS. 9 and 10. In this circuitry, a series of a capacity C01 between the terminal electrodes 62 and 64 and a capacity C02 between the terminal electrodes 63 and 64 is connected to an equivalent resistance R, an equivalent inductance L, and equivalent capacitances C11 and C12 which are contained in the piezoelectric resonator 7, and the terminal electrode 64 is connected to the joint between the capacities C01 and C02.

Figure 12:
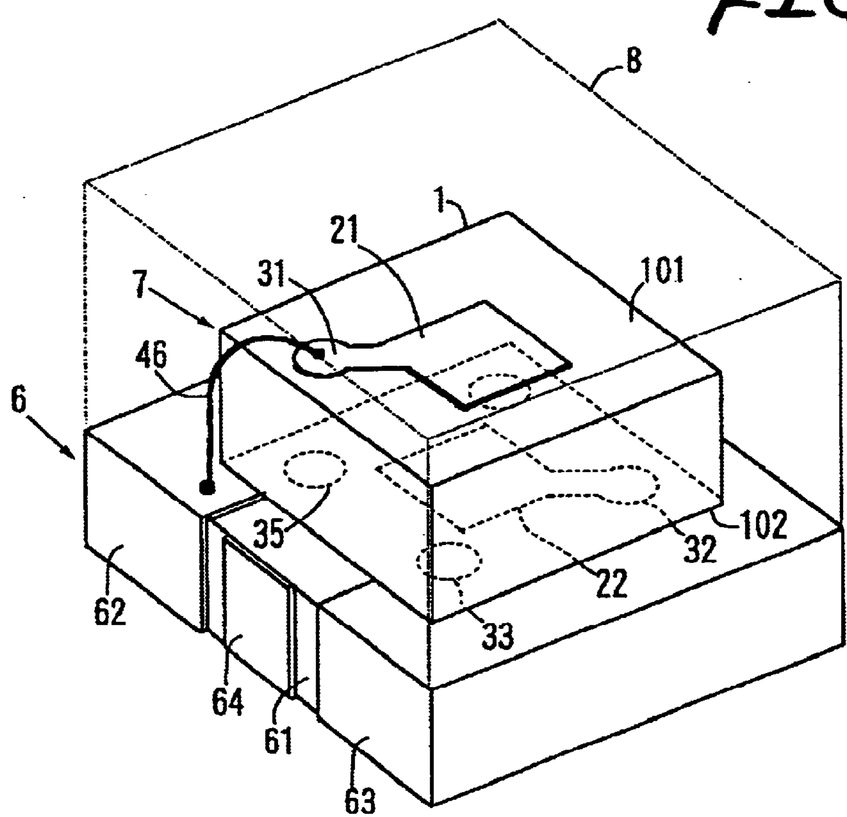
FIG. 12 is a perspective view of a piezoelectric resonator component having the piezoelectric resonator shown in FIGS. 6 and 7.

FIG. 12 is a perspective view of a piezoelectric resonator component using the piezoelectric resonator shown in FIGS. 6 and 7. The same constituent members as in FIG. 9 are given the same reference numbers as used in FIG. 9. In this element, the first pad 31 formed on the side 101 of the piezoelectric substrate 1 is connected to the terminal electrode 62 by an appropriate means, such as wire bonding 46.

Steps for producing the piezoelectric resonator 1 are well known in the art. For example, raw materials mainly including oxides are weighed out to give a desired composition and mixed up in water or an appropriate solvent, such as acetone, by ball milling using zirconia balls. The resulting mixed powder is thoroughly dried and calcined at 700 to 900° C. by, for example, pressing.

The calcined product is ground in, for example, a ball mill, dried, and granulated with an adequate amount of a binder, e.g., polyvinyl alcohol.

The granules are formed into a thin plate of 20 mm width, 20 mm length and about 1.5 mm thickness by use of, e.g., a uniaxial press under a load of 200 to 300 MPa.

The formed sheet is heat-treated to volatilize the binder and then fired at 1100 to 1350° C. The resulting fired product is polished by lapping and then further polished for mirror finish to obtain a substrate.

An electrode for polarization is formed on each side of the substrate by, for example, vacuum deposition of copper. The substrate with electrodes for polarization is subjected to polarization by, for example, immersing in silicone oil heated to 200 to 300° C. and applying an electrical field of 5 to 10 kV/mm for 1 minute.

After the polarization, the electrodes for polarization are removed, and the substrate is trimmed by, for example, dicing to prepare a piezoelectric substrate. Subsequently, an electrode including a metal, e.g., silver is formed on both sides of the piezoelectric substrate by sputtering or a like technique to provide the piezoelectric resonator of the invention.

Hereinafter, other elements of the present invention are described.

Figure 13:
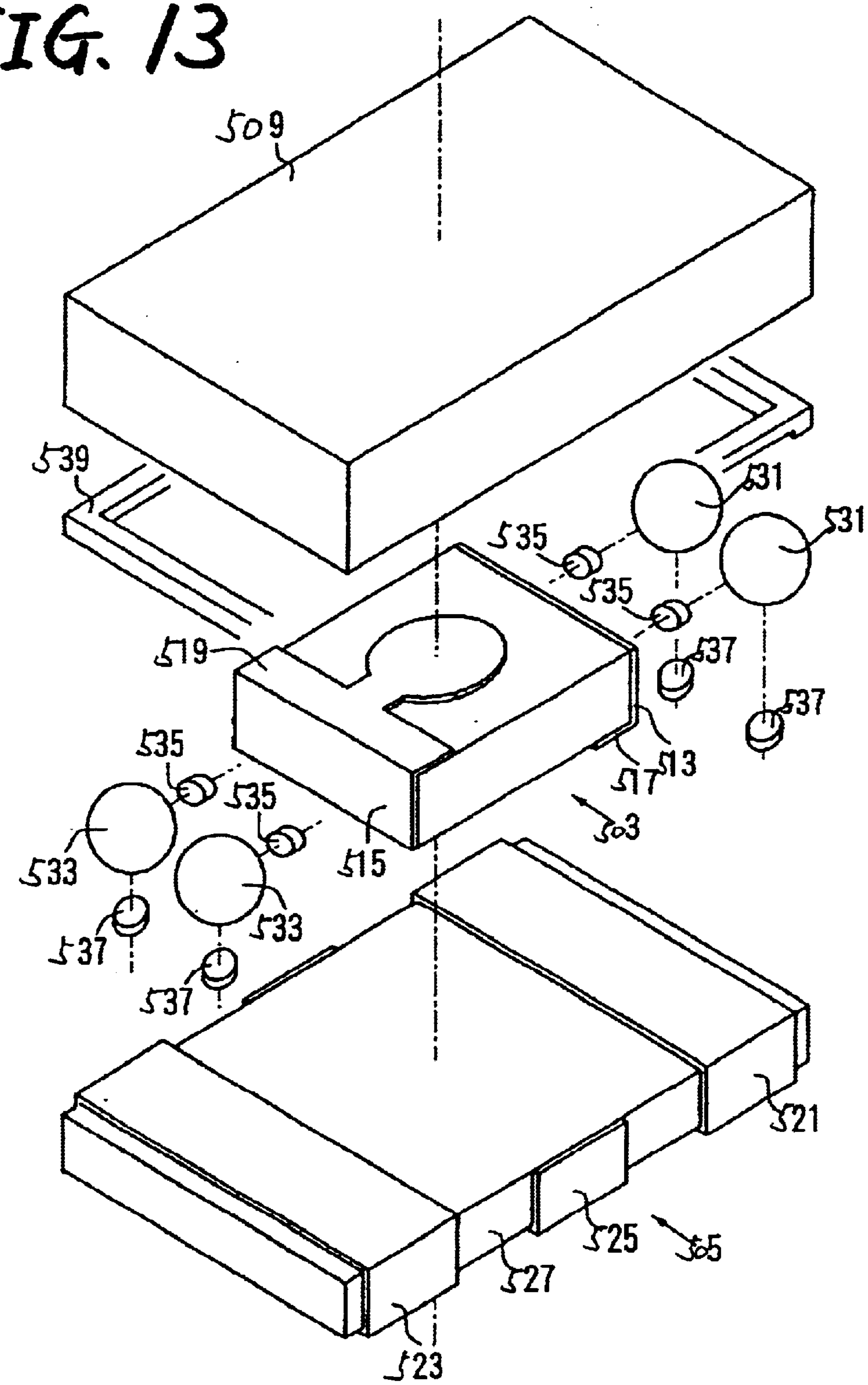
FIG. 13 is an exploded perspective view of a piezoelectric resonator component according to the present invention.
Figure 14:
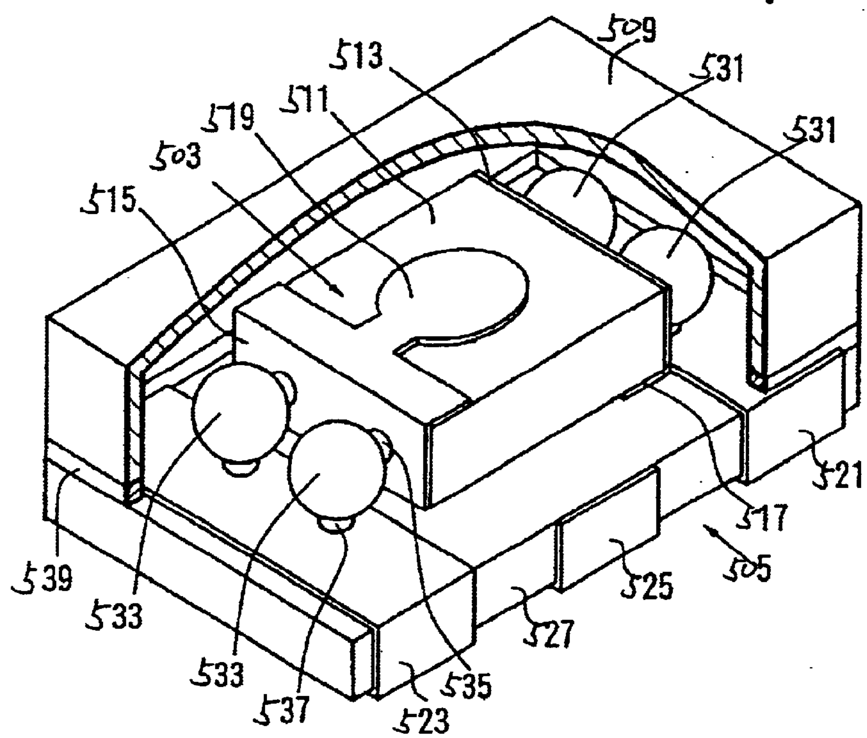
FIG. 14 is a perspective view of the piezoelectric resonator component as assembled with a part cut away.
Figure 15:
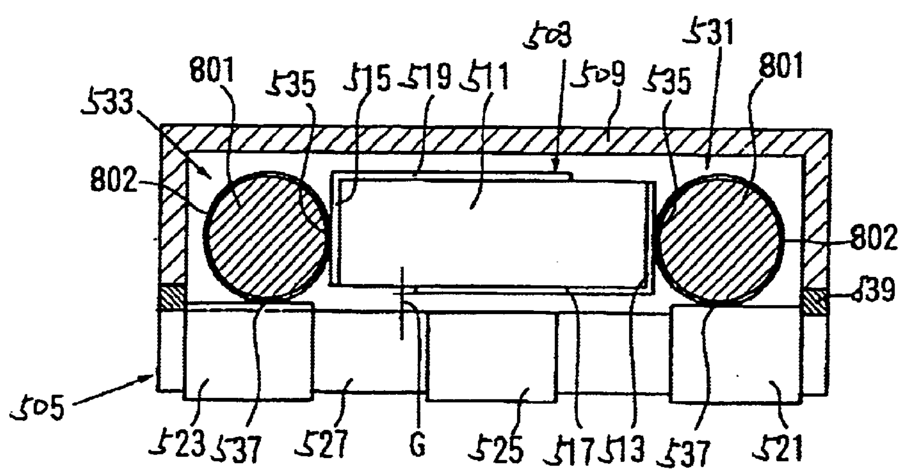
FIG. 15 is a partial enlarged cross-sectional side view of the piezoelectric resonator component, shown in FIGS. 13 and 14, as assembled.
Figure 16:
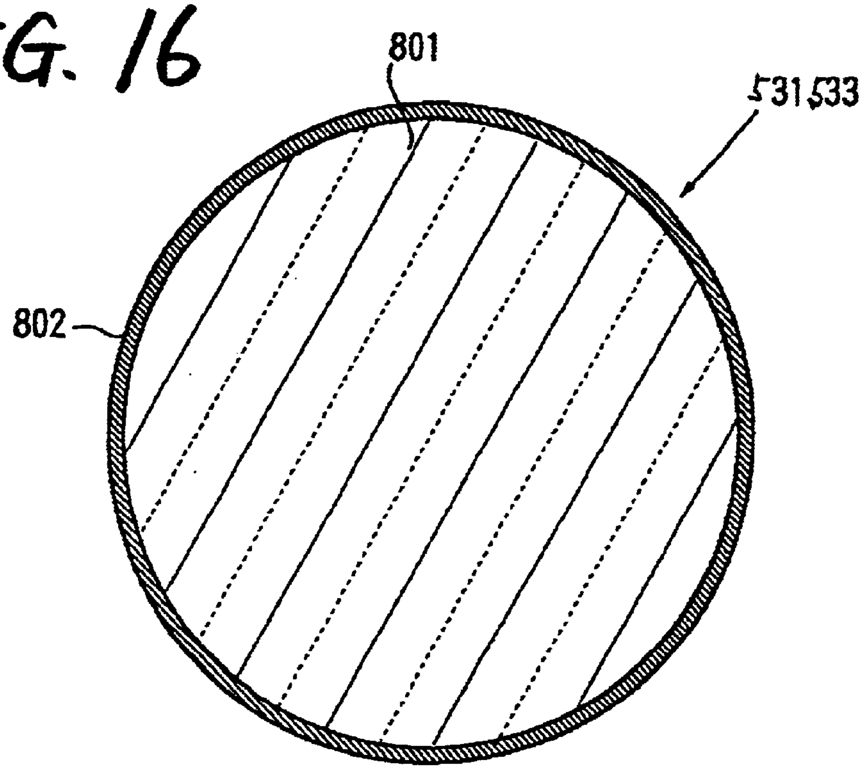
FIG. 16 is an enlarged cross-sectional view of a connecting conductor.

FIG. 13 is an exploded perspective view of a piezoelectric resonator component according to the present invention. FIG. 14 is a perspective view of the piezoelectric resonator component of FIG. 13 as assembled with a part cut away. FIG. 15 is a cross-section of the piezoelectric resonator component of FIG. 14. FIG. 16 is an enlarged cross-section of a connecting conductor. FIGS. 13 through 15 presents an element of the piezoelectric resonator component according to the invention which makes use of fundamental wave vibrations in a thickness extensional vibration mode. The piezoelectric resonator component shown includes a piezoelectric transducer 503, a substrate 505, connecting conductors 531 and 533, and a sealing case 509.

The piezoelectric transducer 503 includes a ceramic piezoelectric element 511, a plurality of lead electrodes 513 and 515, and a plurality of vibrating electrodes 517 and 519. The vibrating electrodes 517 and 519 are disposed on both sides of the piezoelectric element 511 which are perpendicular to the thickness direction to face each other. The lead electrodes 513 and 515 are disposed on both sides of the piezoelectric element 511 which are parallel to the thickness direction. The lead electrodes 513 and 515 are electrically connected to the vibrating electrodes 517 and 519, respectively.

The piezoelectric element 511 is prepared by polishing a sintered product to a prescribed thickness and subjecting to polarization in a high electrical field. The piezoelectric element 511 is preferably made of a lead-free material not including PbO from the environmental consideration. The piezoelectric element 511 can be made of a piezoelectric material having an effective Poisson's ratio of less than ⅓. A satisfactory wave form can be obtained for a fundamental wave even with such a material as has an effective Poisson's ratio of less than ⅓.

Piezoelectric materials having an effective Poisson's ratio of less than ⅓ include compounds having a perovskite structure, such as tantalic acid compounds and niobic acid components, and their solid solutions; compounds having an ilumenite structure and solid solutions thereof; compounds having a pyrochlore structure; bismuth compounds with layer structure; and compounds having a tungsten-bronze structure. The piezoelectric element 11 according to this element includes at least one of these materials as a major component.

The tantalic acid compounds and niobic acid compounds include those including at least one first element selected from sodium (Na), potassium (K), lithium (Li), etc., at least one second element selected from tantalum (Ta) and niobium (Nb), and oxygen, which are represented by formula:

$$ABO_3$$

wherein A is the first element, and B is the second element.

The bismuth compound with a layer structure includes those including bismuth, at least one first element selected from sodium, potassium, barium (Ba), strontium (Sr), lead (Pb), calcium (Ca), yttrium (Y), lanthanides (Ln), bismuth, etc., at least one second element selected from vanadium (V), zirconium (Zr), antimony (Sb), titanium (Ti), niobium, tantalum, tungsten, molybdenum (Mo), etc., and oxygen, which is represented by formula:

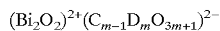

$$(Bi_2O_2)^{2+}(C_{m-1}D_mO_{3m+1})^{2-}$$

wherein C is the first element; D is the second element; and m represents an integer of from 1 to 8.

The tungsten bronze compounds, which are not represented by a general formula, include $NaWO_6BaNaNbO_{15}$, for example.

While the chemical formulae given above represent stoichiometric compounds, the piezoelectric materials which can constitute the piezoelectric element 511 do not need to have a stoichiometric composition.

Of the above-recited materials, bismuth compounds with layer structure are preferred as a material constituting the piezoelectric element 511 for their high mechanical quality factor $Q_m$ and high Curie temperature, which will secure excellent characteristics as a resonator. For example, layer structure compounds including bismuth, strontium, titanium and oxygen are still preferred. Further, those including lanthanum are particularly preferred.

The vibrating electrodes 517 and 519 and the lead electrodes 513 and 515 are formed by thin film formation methods, such as vacuum deposition and sputtering. The vibrating electrodes 517 and 519 and the lead electrodes 513 and 515 can be of Ag, Cu, Cr, and the like. The piezoelectric transducer 503 is, for example, 1 to 1.2 mm wide, 0.4 to 0.5 mm thick and 1 to 1.2 mm long.

The substrate 505 is composed of a ceramic base 527 with a plurality of terminal electrodes 521, 523, and 525 formed on the surface thereof. The terminal electrodes 521 and 523 are provided around the whole circumference of the base 527. Capacities are provided between the terminal electrodes 521 and 525 and between the terminal electrodes 523 and 525. It is preferred that the main ceramic component constituting the substrate 505 be the same as that constituting the piezoelectric element 511.

As shown in FIG. 16, the connecting conductors 531 and 533 respectively comprise a nucleus 801 and an electrically conductive film 802 adhered to the nucleus 801. The connecting conductors 531 and 533 are placed between the lead electrodes 513 and 515 of the piezoelectric transducer 503 and the terminal electrodes 521 and 523 of the substrate 505, respectively, to fixedly connect them both electrically and mechanically. The nucleus 801 is made of a ceramic composition and the linear expansion coefficient of which is close to that of the piezoelectric element 511 or the substrate 505. Specifically, the nucleus 801 and the piezoelectric element 511 or the substrate 505 preferably have the same main ceramic component.

In this particular element, the nucleus 801 with the conductive film 802 has the shape of a ball. It can be of other shapes, such as a hemisphere or a polyhedron. The conductive film 802 includes a conductive resin film. A conductive resin film can be formed by coating the nucleus 801 with a conductive paste containing at least one conducting component selected from the group consisting of Ag, Cu, Ni, Au and Pd followed by drying to cure.

The conductive film 802 can otherwise includes a metal film, which can contain at least one metal selected from the group consisting of Ag, Cu, Ni, Au, and Pd. The metal film can be formed by plating or a like technique. The metal film may have a single layer structure or a multilayer structure. A metallic film having adequate solderability may be provided on the conductive film 802. Further, the metal film and the conductive resin film may be used in combination. The connecting conductors 531 and 533 have a diameter, e.g., of 0.3 to 0.5 mm.

Conductive adhesives 535 and 537 include silver and at least one binder resin selected from a phenolic resin, a urethane/epoxy mixed resin, and an epoxy resin. Examples of curing conditions for the conductive paste are as follows.

| | |
|---|---|
| For phenol type: | 150° C. × 30 min. (in air) |
| For urethane/epoxy type: | 170° C. × 10 min. (in air) |
| For epoxy type: | 200° C. × 30 min. (in air) |

The piezoelectric transducer 503 is mounted on the substrate 505. The connecting conductors 531 and 533 are disposed between the substrate 505 and the piezoelectric transducer 503 in such a manner as to make a gap G between the piezoelectric transducer 503 and the substrate 505.

Owing to ball-shaped in this element, the connecting conductors 531 and 533 make a point contact with the lead electrodes 513 and 515, respectively, of the piezoelectric transducer 503. The conductive adhesive 535 is applied around the point contact, if necessary. The connecting conductors 531 and 533 are thus fixed to the lead electrodes 513 and 515, respectively, to establish mechanical and electrical connections.

It is preferred for the conductive adhesive 535 used for adhesion to the lead electrodes 513 and 515 to have flexibility so that the piezoelectric transducer 503may exhibit their characteristics satisfactorily. In this respect, a urethane/epoxy mixed type or a phenol type is preferred to an epoxy type.

Owing to ball shape in this element, the connecting conductors 531 and 533 make a point contact also with the terminal electrodes 521 and 523, respectively. The conductive adhesive 537 is applied around the point contact, if necessary. The connecting conductors 531 and 533 are thus fixed to the terminal electrodes 521 and 523, respectively, to establish mechanical and electrical connections.

Flexibility is not so required of the conductive adhesive 537 used for adhesion to the terminal electrodes 521 and 523 as required for adhesion to the lead electrodes 513 and 515. Therefore, epoxy resin type adhesives are useful as well as the urethane/epoxy type and the phenol type.

In the present invention, the conductive adhesives 535 and 537 are not always needed. For example, adhesion with a conductive adhesive can be replaced with ultrasonic welding, soldering or a like means depending on the material of the conductive film 802 formed on the nucleus 801.

As described above, in the piezoelectric resonator component of the invention, the piezoelectric transducer 503 has the piezoelectric element 511 with vibrating electrodes 517 and 519 and lead electrodes 513 and 515; the substrate 505 has terminal electrodes 521 and 523 on its surface; and the connecting conductors 531 and 533 are disposed between the lead electrodes 513 and 515 of the piezoelectric transducer 503 and the terminal electrodes 521 and 523 of the substrate 505 to electrically and mechanically connected and fix the transducer 503 and the substrate 505. Therefore, the connection and fixation between the connecting conductors 531 and 533 and the lead electrodes 513 and 515 can be achieved through a point contact by using, for example, ball-shaped connecting conductors as in the above-illustrated embodiment. As a result, vibration energy suppression can be minimized, and the piezoelectric transducer 503 can be supported stably. This connection structure is readily adaptable to a small-sized resonator by proper choice of the connecting conductors 531 and 533 in size to provide the same effects.

These effects make it feasible to provide a piezoelectric resonator component that exhibits stabilized resonance characteristics with a high $Q_{max}$, a typical value representing resonance characteristics, while suppressing dissipation of vibration energy, controlling spurious vibrations, and preventing deterioration of resonance characteristics and instable skipping of necessary oscillation.

Since the nucleus 801 of the connecting conductors 531 and 533 includes ceramics whose linear expansion coefficient is close to that of the piezoelectric element 511 or the substrate 505, the connecting conductors 531 and 533 do not develop cracks due to thermal stress. Unlike conventional resin balls, the connecting conductors 531 and 533 do not change the adhesive area with the substrate 505 or the piezoelectric transducer 503 nor cause seeping of the constituent components which can lead to reduction of adhesive strength. Effects of the present invention will now be illustrated in detail with reference to data of Examples.

EXAMPLE 1

Ten samples of the piezoelectric resonator component having the structure shown in FIGS. 1 to 3 were prepared and subjected to a thermal shock test. In the thermal shock test, the samples were maintained at −40° C. for 30 minutes and then at 85° C. for 30 minutes to make one heat cycle, which was repeated 100 times. The materials of the constituent members, their linear expansion coefficient, and the results of the thermal shock test are shown in Table 1.

EXAMPLE 2

Ten samples of the piezoelectric resonator component having the structure shown in FIGS. 1 to 3 were prepared and subjected to a thermal shock test. In the thermal shock test, the samples were maintained at −40° C. for 30 minutes and then at 85° C. for 30 minutes to make one heat cycle, which was repeated 100 times. The materials of the constituent members, their linear expansion coefficient, and the results of the thermal shock test are shown in Table 1. The difference from Example 1 is that "US" is used in Example 2 as a ceramics substrate, while "SLBT" is used in Example 1. Here, "US" represents $SrTiO_3$—$CaTiO_3$ ceramics, and "SLBT" represents a bismuth compounds with layer structure.

COMPARATIVE EXAMPLE 1

Ten samples of a comparative example were prepared and subjected to a thermal shock test. In the comparative example, the nucleus 801 of the connecting conductors 531 and 533 is a copper ball (Cu ball). In the thermal shock test, the samples were maintained at −40° C. for 30 minutes and then at 85° C. for 30 minutes to make one heat cycle, which was repeated 100 times. The materials of the constituent members, their linear expansion coefficient, and the results of the thermal shock test are shown in Table 1.

TABLE 1

| | Construction | Material | Linear Expansion Coefficient (ppm/° C.) | Test Results |
|---|---|---|---|---|
| Example 1 | Ceramic Piezoelectric Element | SLBT | 8.2 | No Cracks |
| | Nucleus | SLBT | 8.2 | |
| | Ceramic Substrate | SLBT | 8.2 | |
| Example 2 | Ceramic Piezoelectric Element | SLBT | 8.2 | No Cracks |
| | Nucleus | SLBT | 8.2 | |
| | Ceramic Substrate | US | 7.64 | |
| Comparative Example 1 | Ceramic Piezoelectric Element | SLBT | 8.2 | Cracks Developed |
| | Nucleus | Cu | 16.5 | |
| | Ceramic Substrate | US | 7.64 | |

As shown in Table 1, all the ten samples of Comparative Example 1, in which a copper ball was used as a nucleus, developed cracks between the balls and the conductive adhesive (thermosetting resin). To the contrary, every sample of Examples 1 and 2, in which a ceramic ball (SLBT) was used as a nucleus, suffered from no cracks in the conductive adhesive layers (thermosetting resin).

It is desirable that the connecting conductors 531 and 533 be connected to the piezoelectric transducer 503 in areas showing a small vibration displacement as described hereunder.

Figure 17:
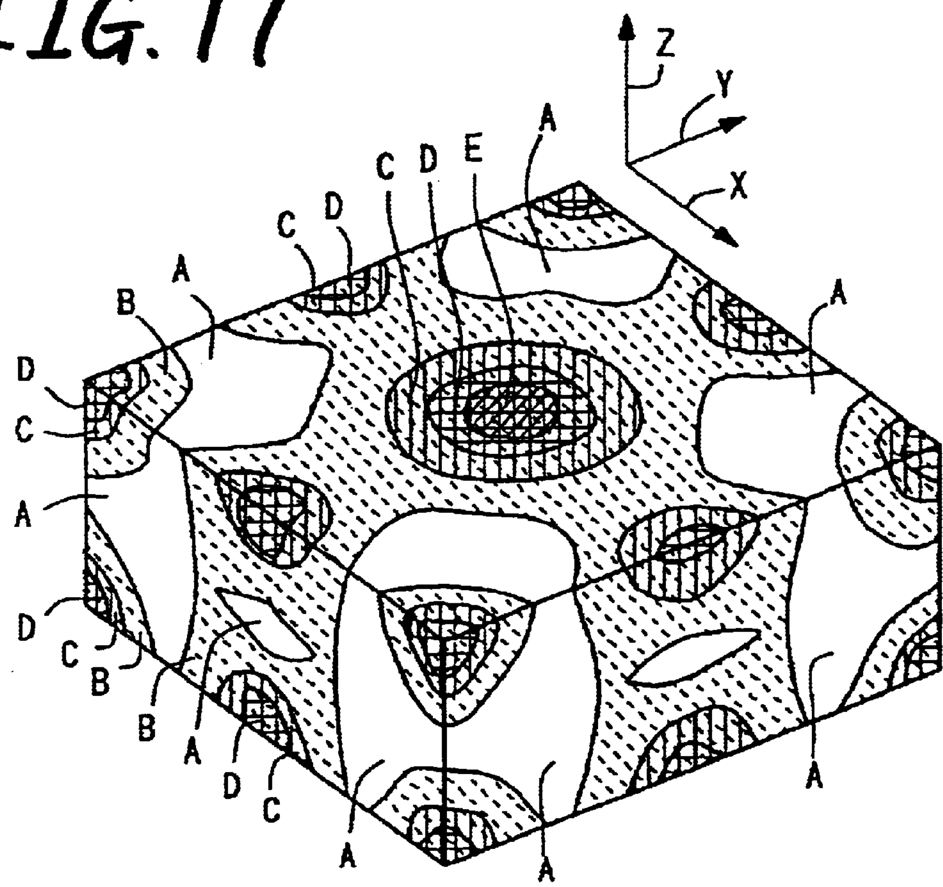
FIG. 17 is a computer-simulated vibration displacement distribution in a piezoelectric transducer included in the piezoelectric resonator component shown in FIGS. 13 to 15, as operated at the fundamental frequency of the thickness extensional vibration mode.

FIG. 17 is a computer-simulated vibration displacement distribution in a piezoelectric transducer used in the piezoelectric resonator component shown in FIGS. 13 to 15, as operated at the fundamental frequency of the thickness extensional vibration mode. In FIG. 17, the vibration displacement is displayed on an A-to-E five scale. Area A represented by a blank has the smallest displacement. The displacement increases in the order of area B (shadowed with broken lines), area C (shadowed with vertical solid lines), area D (shadowed with transverse solid lines), and area E (shadowed with slant solid lines).

As illustrated in FIG. 17, when the hexahedral piezoelectric element 511 is operated at the fundamental frequency of the thickness extensional vibration mode, area A having the least vibration displacement appears in the four corner areas.

In the element shown in FIGS. 13 to 15, the connecting conductors 531 and 533 are connected to the piezoelectric transducer 503 in the area A, where the vibration displacement is the least, on each side of the piezoelectric transducer 503. As a result, the vibration energy suppression by the connecting conductors 531 and 533 can be minimized; vibration energy dissipation can be suppressed; insufficient control on spurious vibrations can be compensated for; deterioration of resonance characteristics and oscillation defects, such as instable vibration skipping, can be suppressed; and there is obtained a piezoelectric resonator component with stable resonance characteristics having a high $Q_{max}$, a typical value representing resonance characteristics.

As shown in FIG. 17, the area A showing the least vibration displacement also appears in four corner areas on each side of the piezoelectric element 511 perpendicular to the thickness direction. Therefore, the above-described effects are manifested similarly when the connecting conductors 531 and 533 are connected in the four corner areas on each side of the piezoelectric element 511 perpendicular to the thickness direction.

As described above, the present invention produces the following effects.

(a) A piezoelectric resonator which can be supported stably with minimized suppression of vibration energy and a component having such a resonator are provided.

(b) A small-sized piezoelectric resonator which can be supported stably with minimized vibration energy suppression and a component having such a resonator are provided.

(c) A piezoelectric resonator which exhibits stabilized resonance characteristics with a high $Q_{max}$, a typical value representing resonance characteristics, and a component containing such a resonator are provided.

(d) A highly reliable piezoelectric resonator component which does not develop thermal shock-induced cracks in the joints between the substrate and the piezoelectric transducer.

(e) A piezoelectric resonator component which does not suffer from reduction in adhesive strength at the joints between the substrate and the piezoelectric transducer.

While only certain embodiments of the invention have been specifically described herein, it will be apparent that numerous modifications may be made thereto without departing from the spirit and scope of the invention.

What is claimed is:

1. A piezoelectric resonator comprising;

a piezoelectric substrate;

a first vibrating electrode;

a second vibrating electrode;

a first pad; and a second pad, wherein:

said piezoelectric substrate is a hexahedron;

said first vibrating electrode is disposed on a first side of said piezoelectric substrate perpendicular to a thickness direction;

said second vibrating electrode is disposed on a second side of said piezoelectric substrate perpendicular to the thickness direction, and faces to said first vibrating electrode;

said first pad and said second pad are respectively disposed in predetermined area having a small vibration displacement on at least one side of said piezoelectric substrate perpendicular to the thickness direction;

said first pad is made of an electrical conductor and electrically connected to said first vibrating electrode; and said second pad is made of an electrical conductor and electrically connected to said second vibrating electrode.

2. The piezoelectric resonator according to claim 1, wherein said first pad and said second pad are disposed on the same side.

3. The piezoelectric resonator according to claim 1, wherein said first pad and said second pad are disposed on different sides.

4. The piezoelectric resonator according to claim 1, wherein said first pad and said second pad respectively include an electrically conductive film and a bump, and wherein said conductive film is adhered to a surface of said piezoelectric substrate, and said bump is adhered to said conductive film.

5. The piezoelectric resonator according to claim 1, further comprising:

a third pad; and a fourth pad, wherein said third pad and said fourth pad are respectively disposed in an area having a small vibration displacement on at least one side of said piezoelectric substrate perpendicular to the thickness direction.

6. The piezoelectric resonator according to claim 5, wherein said third pad and said fourth pad are made of an electrical conductor.

7. The piezoelectric resonator according to claim 6, wherein said third pad and said fourth pad respectively include an electrically conductive film and a bump, wherein said conductive film is adhered to a surface of said piezoelectric substrate, and said bump is adhered to said conductive film.

8. The piezoelectric resonator according to claim 5, wherein said third pad and said fourth pad are made of an electrical insulator.

9. The piezoelectric resonator according to claim 4, wherein said bump is made of at least one selected from the group consisting of Au, Pt, Pd, Ag, Cu, Ni, Al, an alloy thereof, and solder.

10. The piezoelectric resonator according to claim 1, wherein the area having a small vibration displacement is selected from at least a portion of four corner areas of the first side.

11. The piezoelectric resonator according to claim 1, which operates in a basic wave thickness extensional vibration mode.

12. The piezoelectric resonator according to claim 1, wherein said piezoelectric substrate is made of a lead-free piezoelectric material.

13. A piezoelectric resonator component comprising:

a piezoelectric resonator; and a substrate, wherein said piezoelectric resonator is the piezoelectric resonator including:

a piezoelectric substrate;

a first vibrating electrode;

a second vibrating electrode;

a first pad; and a second pad, wherein:

said piezoelectric substrate is a hexahedron;

said first vibrating electrode is disposed on a first side of said piezoelectric substrate perpendicular to a thickness direction;

said second vibrating electrode is disposed on a second side of said piezoelectric substrate perpendicular to the thickness direction, and faces to said first vibrating electrode;

said first pad and said second pad are respectively disposed in predetermined area having a small vibration displacement on at least one side of said piezoelectric substrate perpendicular to the thickness direction;

said first pad is made of an electrical conductor and electrically connected to said first vibrating electrode; and said second pad is made of an electrical conductor and electrically connected to said second vibrating electrode, and wherein said substrate has at least two terminal electrodes on a surface thereof, and wherein said piezoelectric resonator is mounted on the surface of said substrate, and said first pad and said second pad are connected to said two terminal electrodes.

14. A method of producing a piezoelectric resonator component, wherein said piezoelectric resonator component includes a piezoelectric resonator and a substrate, and said piezoelectric resonator includes a piezoelectric substrate, a first vibrating electrode, a second vibrating electrode, a first pad, and a second pad, and said piezoelectric substrate is a hexahedron, and said first vibrating electrode is disposed on a first side of said piezoelectric substrate perpendicular to a thickness direction, and said second vibrating electrode is disposed on a second side of said piezoelectric substrate perpendicular to the thickness direction, and is opposing to said first vibrating electrode, and said first pad and said second pad are respectively disposed in an area having a small vibration displacement on at least one side of said piezoelectric substrate perpendicular to the thickness direction, and said first pad is made of an electrically conductive film and electrically connected to said first vibrating electrode, and said second pad is made of an electrically conductive film and electrically connected to said second vibrating electrode, and said substrate has at least two terminal electrodes on a surface thereof, said method comprising:

forming a bump on said electrically conductive film constituting each of said first pad and said second pad; and mounting said piezoelectric resonator on the surface of said substrate and connecting said first pad and said second pad to said two terminal electrodes via said bump.

15. The method of producing a piezoelectric resonator component according to claim 14, further comprising:

forming a third pad and a fourth pad in an area having a small vibration displacement on a side of said piezoelectric substrate perpendicular to the thickness direction and facing the side on which said third pad and said fourth pad are formed to the surface of said substrate.

16. The method of producing a piezoelectric resonator component according to claim 15, wherein said third pad and said fourth pad are made of an electrical conductor.

17. The method of producing a piezoelectric resonator component according to claim 16, wherein said third pad and said fourth pad are respectively formed by adhering an electrically conductive film to said piezoelectric substrate and applying a bump on said electrically conductive film.

18. The method of producing a piezoelectric resonator component according to claim 14, wherein the area having a small vibration displacement is selected from at least a portion of four corner areas of the first side.

19. A piezoelectric resonator component comprising:

a piezoelectric transducer;

a substrate; and connecting conductors;

wherein:

said piezoelectric transducer includes a ceramic piezoelectric element, vibrating electrodes, and lead electrodes;

said substrate has terminal electrodes on a surface thereof; and each of said connecting conductors includes a nucleus and an electrically conductive film adhered to a surface of the nucleus and is disposed between said lead electrode of said piezoelectric transducer and said terminal electrode of said substrate to electrically and mechanically connect and fix these electrodes, and said nucleus includes ceramics whose linear expansion coefficient is close to that of one of said piezoelectric element and said substrate.

20. The piezoelectric resonator component according to claim 19, wherein said nucleus of said connecting conductor has a ball shape.

21. The piezoelectric resonator component according to claim 19, Wherein said electrically conductive film of said connecting conductor includes an electrically conductive resin film.

22. The piezoelectric resonator component according to claim 19, wherein said electrically conductive film of said connecting conductor includes a metal film.

23. The piezoelectric resonator component according to claim 22, wherein said metal film includes at least one of Ag, Cu, Ni, Au and Pd.

24. The piezoelectric resonator component according to claim 19, wherein said piezoelectric transducer operates in a thickness extensional vibration mode.

25. The piezoelectric resonator component according to claim 24, wherein said vibrating electrodes are a pair of vibrating electrodes disposed on each side of said piezoelectric element perpendicular to the thickness direction, and wherein said connecting conductors are respectively connected to each of said lead electrodes of said piezoelectric transducer at a point where said piezoelectric transducer has the least vibration displacement.

26. The piezoelectric resonator component according to claim 19, wherein said piezoelectric transducer utilizes fundamental wave vibrations.

27. The piezoelectric resonator component according to claim 26, wherein the piezoelectric element has an effective Poisson's ratio of less than $\frac{1}{3}$.

28. The piezoelectric resonator component according to claim 19, wherein said piezoelectric transducer includes a piezoelectric substrate made of a lead-free piezoelectric material.

* * * * *